(12) United States Patent
Yuan et al.

(10) Patent No.: US 8,217,412 B2
(45) Date of Patent: Jul. 10, 2012

(54) SOLID STATE LIGHTING COMPONENT (75) Inventors: Thomas Yuan, Ventura, CA (US);
Bernd Keller, Santa Barbara, CA (US);
James Ibbetson, Santa Barbara, CA (US); Eric Tarsa, Goleta, CA (US);
Gerald Negley, Durham, NC (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 12/883,979

(22) Filed: Sep. 16, 2010

(65) Prior Publication Data
US 2011/0012143 A1 Jan. 20, 2011

Related U.S. Application Data (60) Division of application No. 12/154,691, filed on May 23, 2008, now Pat. No. 7,821,023, which is a continuation-in-part of application No. 11/982,275, filed on Oct. 31, 2007, and a continuation-in-part of application No. 11/743,324, filed on May 2, 2007, now Pat. No. 8,125,137, which is a continuation-in-part of application No. 11/032,363, filed on Jan. 10, 2005, now Pat. No. 7,564,180.

(51) Int. Cl.
*H01L 33/00* (2010.01)
(52) U.S. Cl. ............... 257/98; 257/89; 257/91; 362/235; 362/249
(58) Field of Classification Search .................... 257/89, 257/91, 98; 362/235, 249, 252
See application file for complete search history.

(56) References Cited

U.S. PATENT DOCUMENTS

| | | | |
|---|---|---|---|
| 3,760,237 A | 9/1973 | Jaffe | 257/98 |
| 4,307,297 A | 12/1981 | Groff | |
| 4,511,425 A | 4/1985 | Boyd | 156/493 |
| 4,946,547 A | 8/1990 | Palmour et al. | 156/643 |
| 5,040,868 A | 8/1991 | Waitl | |
| 5,130,761 A | 7/1992 | Tanaka | 357/17 |
| 5,167,556 A | 12/1992 | Stein | |
| 5,200,022 A | 4/1993 | Kong et al. | 156/612 |
| RE34,861 E | 2/1995 | Davis et al. | 437/100 |
| 5,703,401 A | 12/1997 | van de Water | |
| 5,706,177 A | 1/1998 | Nather | |
| 5,790,298 A | 8/1998 | Tonar | 359/267 |

(Continued)

FOREIGN PATENT DOCUMENTS

CN 1581527 A 2/2005

(Continued)

OTHER PUBLICATIONS

International Search Report and Written Opinion from PCT Application No. PCT/US2010/003190 Mailed Apr. 6, 2011.

(Continued)

*Primary Examiner* — Phuc Dang
(74) *Attorney, Agent, or Firm* — Koppel, Patrick, Heybl & Philpott (57) ABSTRACT

An LED component comprising an array of LED chips mounted on a planar surface of a submount with the LED chips capable of emitting light in response to an electrical signal. The LED chips comprise respective groups emitting at different colors of light, with each of the groups interconnected in a series circuit. A lens is included over the LED chips. Other embodiments can comprise thermal spreading structures included integral to the submount and arranged to dissipate heat from the LED chips.

7 Claims, 5 Drawing Sheets

U.S. PATENT DOCUMENTS

| | | | |
|---|---|---|---|
| 5,813,753 A | 9/1998 | Vriens et al. | 362/293 |
| 5,907,151 A | 5/1999 | Gramann | |
| 5,959,316 A | 9/1999 | Lowery | 257/98 |
| 6,061,160 A | 5/2000 | Maruyama | 359/152 |
| 6,066,861 A | 5/2000 | Hohn et al. | |
| 6,183,100 B1 | 2/2001 | Suckow et al. | 362/35 |
| 6,224,216 B1 | 5/2001 | Parker et al. | |
| 6,259,608 B1 | 7/2001 | Berardinelli et al. | |
| 6,296,367 B1 | 10/2001 | Parsons et al. | 362/183 |
| 6,359,236 B1 | 3/2002 | DiStefano et al. | |
| 6,376,902 B1 | 4/2002 | Arndt | 257/678 |
| 6,454,437 B1 | 9/2002 | Kelly | 362/246 |
| 6,469,321 B2 | 10/2002 | Arndt | |
| 6,573,580 B2 | 6/2003 | Arndt | |
| 6,610,563 B1 | 8/2003 | Waitl et al. | |
| 6,614,058 B2 | 9/2003 | Lin et al. | |
| 6,624,491 B2 | 9/2003 | Waitl et al. | |
| 6,661,029 B1 | 12/2003 | Duggal | 257/89 |
| 6,680,490 B2 | 1/2004 | Yasukawa et al. | |
| 6,686,609 B1 | 2/2004 | Sung | |
| 6,707,069 B2 | 3/2004 | Song et al. | 257/79 |
| 6,710,373 B2 | 3/2004 | Wang | |
| 6,759,733 B2 | 7/2004 | Arndt | |
| 6,770,498 B2 | 8/2004 | Hsu | 438/26 |
| 6,774,401 B2 | 8/2004 | Nakada et al. | |
| 6,858,879 B2 | 2/2005 | Waitl | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,919,586 B2 | 7/2005 | Fujii | |
| 6,940,704 B2 | 9/2005 | Stalions | |
| 6,946,714 B2 | 9/2005 | Waitl | |
| 6,975,011 B2 | 12/2005 | Arndt et al. | |
| 6,995,510 B2 | 2/2006 | Murakami et al. | |
| 7,021,797 B2 | 4/2006 | Minano et al. | 362/355 |
| 7,064,907 B2 | 6/2006 | Kaneko | |
| 7,066,626 B2 | 6/2006 | Omata | |
| 7,102,213 B2 | 9/2006 | Sorg | |
| 7,119,422 B2 | 10/2006 | Chin | 257/666 |
| 7,224,000 B2 | 5/2007 | Aanegola et al. | 257/98 |
| 7,285,802 B2 | 10/2007 | Ouderkirk et al. | 257/98 |
| D572,210 S | 7/2008 | Lee | D13/180 |
| D572,670 S | 7/2008 | Ono et al. | D13/180 |
| D576,574 S | 9/2008 | Kobayakawa | D13/180 |
| 2002/0001193 A1* | 1/2002 | Osawa et al. | 362/249 |
| 2002/0029071 A1 | 3/2002 | Whitehurst | |
| 2002/0061174 A1 | 5/2002 | Hurt et al. | |
| 2002/0093820 A1* | 7/2002 | Pederson | 362/241 |
| 2002/0113246 A1 | 8/2002 | Nagai et al. | |
| 2002/0123163 A1 | 9/2002 | Fujii | |
| 2002/0163001 A1 | 11/2002 | Shaddock | |
| 2002/0171911 A1 | 11/2002 | Maegawa | |
| 2002/0195935 A1 | 12/2002 | Jager et al. | |
| 2003/0058641 A1* | 3/2003 | Watanabe et al. | 362/235 |
| 2003/0147055 A1* | 8/2003 | Yokoyama | 353/98 |
| 2003/0183852 A1 | 10/2003 | Takenaka | |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0126913 A1 | 7/2004 | Loh | |
| 2004/0227149 A1 | 11/2004 | Ibbetson | |
| 2004/0232435 A1 | 11/2004 | Hofer et al. | |
| 2004/0238930 A1 | 12/2004 | Arndt | |
| 2004/0256626 A1 | 12/2004 | Wang | |
| 2005/0023548 A1 | 2/2005 | Bhat | |
| 2005/0072981 A1 | 4/2005 | Suenaga | |
| 2005/0093005 A1 | 5/2005 | Ruhnau | |
| 2005/0093422 A1 | 5/2005 | Wang | |
| 2005/0127377 A1 | 6/2005 | Arndt | |
| 2005/0179376 A1 | 8/2005 | Fung et al. | |
| 2006/0022212 A1 | 2/2006 | Waitl | |
| 2006/0049477 A1 | 3/2006 | Arndt | |
| 2006/0105484 A1* | 5/2006 | Basin et al. | 438/27 |
| 2006/0108594 A1 | 5/2006 | Iwasaki et al. | |
| 2006/0157828 A1 | 7/2006 | Sorg | |
| 2006/0180818 A1 | 8/2006 | Nagai et al. | |
| 2006/0258028 A1 | 11/2006 | Paolini | |
| 2007/0030676 A1 | 2/2007 | Ichihara | |
| 2007/0046176 A1 | 3/2007 | Bukesov et al. | |
| 2007/0109779 A1 | 5/2007 | Sekiguchi et al. | |
| 2007/0139920 A1 | 6/2007 | Van De Ven et al. | |
| 2007/0223219 A1 | 9/2007 | Medendorp | |
| 2007/0269586 A1 | 11/2007 | Leatherdale | |
| 2007/0295972 A1 | 12/2007 | Tsai et al. | |
| 2008/0074029 A1 | 3/2008 | Suehiro | |
| 2008/0100774 A1 | 5/2008 | Jeon et al. | |
| 2008/0128735 A1 | 6/2008 | Yoo | |
| 2008/0137357 A1 | 6/2008 | Friedrichs et al. | |
| 2008/0151527 A1 | 6/2008 | Ueno | |
| 2008/0170396 A1 | 7/2008 | Yuan et al. | |
| 2008/0186702 A1 | 8/2008 | Camras et al. | |
| 2008/0238335 A1 | 10/2008 | Lee | |
| 2009/0050907 A1 | 2/2009 | Yuan et al. | |
| 2009/0050908 A1 | 2/2009 | Yuan et al. | |
| 2009/0160363 A1 | 6/2009 | Negley | |

FOREIGN PATENT DOCUMENTS

| | | |
|---|---|---|
| CN | 1591924 A | 3/2005 |
| CN | 1679168 A | 10/2005 |
| CN | 1744335 A | 3/2006 |
| EP | 1005085 A2 | 5/2000 |
| EP | 1187226 A1 | 3/2002 |
| EP | 1187227 | 3/2002 |
| EP | 1187228 | 3/2002 |
| EP | 1521313 | 4/2005 |
| EP | 2056363 A2 | 5/2009 |
| JP | 8139257 | 5/1996 |
| JP | 2000223752 | 8/2000 |
| WO | WO9931737 | 6/1999 |
| WO | WO0217405 | 2/2002 |
| WO | WO2004027882 | 4/2004 |
| WO | WO2004044877 | 5/2004 |
| WO | WO2005013365 A2 | 2/2005 |
| WO | WO2005043627 A1 | 5/2005 |
| WO | WO 2006/001221 A1 | 1/2006 |
| WO | WO2006054228 A2 | 5/2006 |
| WO | WO2006054228 A3 | 5/2006 |
| WO | WO 2009/157999 A1 | 12/2009 |

OTHER PUBLICATIONS

International Search Report and Written Opinion for PCT/US2010/003168 mailed Apr. 26, 2011.

Office Action from U.S. Appl. No. 12/288,957, dated: Sep. 21, 2010.

Response to Office Action from U.S. Appl. No. 12/288,957, filed Dec. 21, 2010.

Office Action from U.S. Appl. No. 12/629,735, dated: Sep. 22, 2010.

Response to Office Action from U.S. Appl. No. 12/629,735, filed Dec. 22, 2010.

Office Action from U.S. Appl. No. 12/288,957, dated: Mar. 9, 2011.

Office Action from U.S. Appl. No. 12/629,735, dated: Mar. 10, 2011.

Office Action from U.S. Appl. No. 12/156,995, dated: Mar. 10, 2010.

Response to Office Action from U.S. Appl. No. 12/156,995, filed Sep. 10, 2010.

Response to Office Action from U.S. Appl. No. 12/156,995, filed Apr. 18, 2011.

Office Action from U.S. Appl. No. 12/156,995, dated: Nov. 17, 2010.

PCT Invitation to Pay Additional Fees and Communication Relating to the Results of Partial International Search for related PCT application No. PCT/US2009/001628, dated: Oct. 12, 2009.

Declaration of Gerald Negley under 37 C.F.R.§1.132, Dated: Aug. 20, 2009.

Declaration of Charles Swoboda under 37 C.F.R.§1.132, Dated: Aug. 20, 2009.

International Search Report and Written Opinion From Related PCT Application No. PCT/US2009/001628, dated: Dec. 3, 2009.

JP 2001 060072A, Abstract, Matsushita Electric IND. CO LTD., Mar. 6, 2001.

Lamina, Inc., Titan Turbo™ LED Light Engines, Data Sheet, 2008.

Cree, Inc. Cree® XLamp® XR-E and XR-C LED Data Sheet, 2007, pp. 1-11.

Cree, Inc. Cree® EZ1000™ EZBright LED Data Sheet, 2006, pp. 1-6.

Cree, Inc. Cree® EZ700™ EZBright LED Data Sheet, 2006, pp. 1-6.

U.S. Appl. Nos. 11/656,759, filed Jan. 22, 2007 and 11/899,790, filed Sep. 7, 2007, "Wafer Level Phosphor Coating Method and Devices Fabricated Utilizing Method".

U.S. Appl. No. 11/473,089, filed Jun. 21, 2006, "Close Loop Electrophoretic Deposition of Semiconductor Devices".

Nichia Corp. White LED Part No. NSPW300BS, Specification for Nichia White Led, Model NSPW300BS., Jan. 14, 2004.

Nicha Corp., White LED Part No. NSPW312BS, Specification for Nichia White Led, Model NSPW312BS. Jan. 14, 2004.

Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.

Office Action from U.S. Appl. No. 12/154,691, dated: Sep. 29, 2009

Response from U.S. Appl. No. 12/154,691, dated: Nov. 23, 2009.

Notice of Allowance for U.S. Appl. No. 12/154,691, dated: Jun. 17, 2010.

\* cited by examiner

| System Output 1000 Lumen | | | | | |
|---|---|---|---|---|---|
| Chip Type | EZ700 | EZ700 | EZ700 | EZ1000 | EZ1000 |
| Number Of LED Chips pro System | 24 | 24 | 24 | 12 | 12 |
| Single Chip Operating Voltage (Volts) | 3.2 | 3.2 | 3.2 | 3.2 | 3.2 |
| Single Chip Operating Current (Amp) | 0.175 | 0.175 | 0.175 | 0.35 | 0.35 |
| Connection Options | | | | | |
| Number Of LED Strings | 1 | 2 | 3 | 1 | 2 |
| Number Of LEDs per String | 24 | 12 | 8 | 12 | 6 |
| LED Voltage per String (Volt) | 76.8 | 38.4 | 25.6 | 38.4 | 19.2 |
| LED Current per String (Amp) | 0.175 | 0.35 | 0.525 | 0.35 | 0.7 |
| Total LED Power (W) | 13.44 | 13.44 | 13.44 | 13.44 | 13.44 |
| Driver Cost | | lowest | medium | higher | medium | highest |

SOLID STATE LIGHTING COMPONENT

This application is a divisional of, and claims the benefit of, U.S. patent application Ser. No. 12/154,691 (U.S. Pat. No. 7,821,023) to Yuan et al., filed on May 23, 2008, which is a continuation-in-part of, and claims the benefit of, U.S. patent application Ser. No. 11/982,275 to Keller et al., filed on Oct. 31, 2007, and is a continuation-in-part of and claims the benefit of, U.S. patent application Ser. No. 11/743,324 to Medendorp et al., filed on May 2, 2007, now U.S. Pat. No. 8,125,137 which is a continuation-in-part of, and claims the benefit of, U.S. patent application Ser. No. 11/032,363 (U.S. Pat. No. 7,564,180) to Goerge R. Brandes, filed on Jan. 10, 2005.

This invention was made with Government support under Contract No. DE-DE-FC26-06NT42932 awarded by the National Energy Technology Laboratory. The Government has certain rights in this invention.

BACKGROUND OF THE INVENTION

1. Field of the Invention

This invention relates to methods for solid state lighting and in particular compact monolithic solid state lamps comprising multiple lighting elements.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Figure 1A:
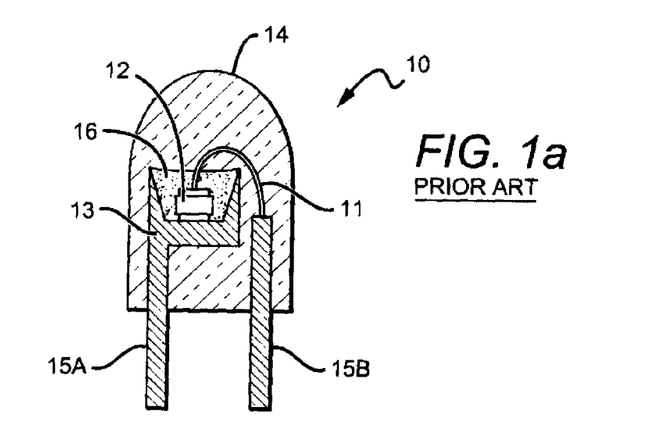
FIG. 1a shows a sectional view of one embodiment of a prior art LED lamp.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1a, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1a, since it may be difficult to extract heat through the leads 15A, 15B.

Figure 1B:
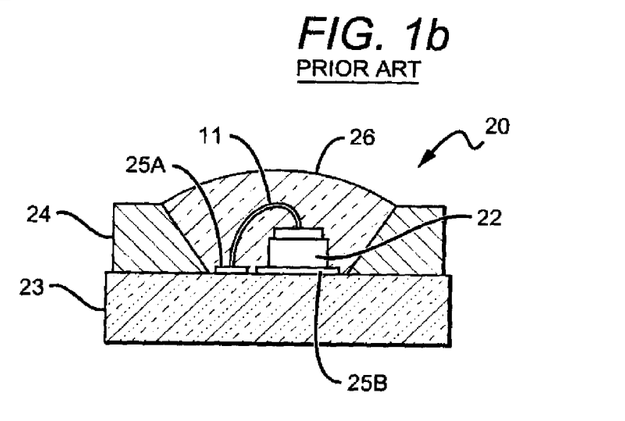
FIG. 1b shows a sectional view of another embodiment of prior art LED lamp.

A conventional LED package 20 illustrated in FIG. 1b may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

Typical LED components for solid state lighting applications attempt to achieve high light output by operating single LED chips at as high as possible current and at a low voltage typical for individual LEDs. For higher powered operation it may also be difficult to transfer dissipate heat generated by the LED chip 22. Submounts 23 can be made of materials such as ceramics that are not efficient at conducting heat. Heat from the LED chip passes into the submount below the LED chip, but does not efficiently spread laterally from below the LED. This increased heat can result in reduced lifetime or failure of the package.

At the systems level high current operation necessitates relatively expensive drivers to provide the constant DC current source for such components. Operating SSL components at lower currents and higher voltages instead would provide for lower cost driver solutions and ultimately lower system costs. This is currently achieved by assembling multiple LED components of a suitable current rating in series at the circuit board level. The lower driver cost for such solutions is outweighed by the high cost of the individual components.

Figure 2:
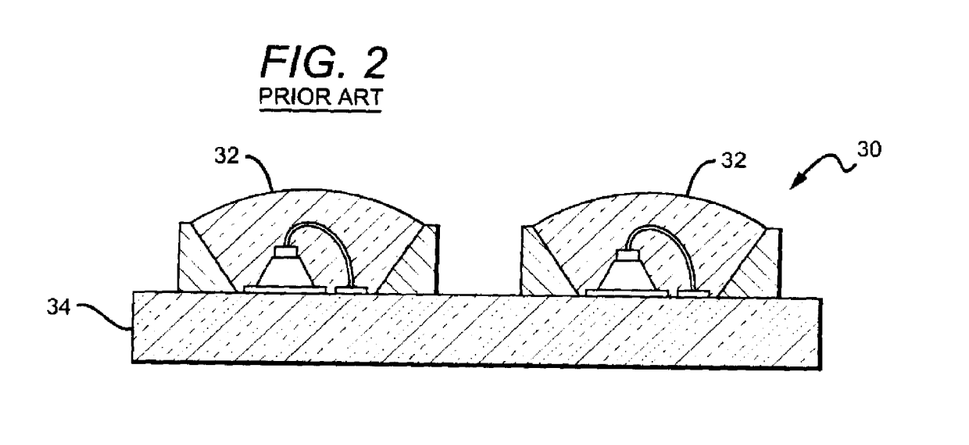
FIG. 2 shows a sectional view of one embodiment of a prior art LED component.

Current LED packages (e.g. XLamp® LEDs provided by Cree, Inc.) can be limited in the level of input power and for some the range is 0.5 to 4 Watts. Many of these conventional LED packages incorporate one LED chip and higher light output is achieved at the assembly level by mounting several of these LED packages onto a single circuit board. FIG. 2 shows a sectional view of one such distributed integrated LED array 30 comprising a plurality of LED packages 32 mounted to a substrate or submount 34 to achieve higher luminous flux. Typical arrays include many LED packages, with FIG. 2 only showing two for ease of understanding. Alternatively, higher flux components have been provided by utilizing arrays of cavities, with a single LED chip mounted in each of the cavities. (e.g. TitanTurbo™ LED Light Engines provided by Lamina, Inc.).

These LED array solutions are less compact than desired as they provide for extended non-light emitting "dead space" between adjacent LED packages and cavities. This dead space provides for larger devices, and can limit the ability to shape the output beam by a single compact optical element like a collimating lens or reflector into a particular angular distribution. This makes the construction of solid state lighting luminares that provide for directed or collimated light output within the form factor of existing lamps or even smaller difficult to provide. These present challenges in providing a compact LED lamp structure incorporating an LED component that delivers light flux levels in the 1000 Lumen and higher range from a small optical source.

Current high operating voltage luminaire solutions integrate multiple discrete LED components as assemblies at the circuit boards level. To achieve the desired beam shape individual optical lenses are mounted with each LED component, or very large reflectors (larger than the form of existing conventional sources) have to be employed. These secondary optical elements (lenses or reflectors) are large and costly, and the extended area of such single chip arrays further provides for a more expensive LED luminaire. Additionally, any light being reflected from the sidewalls in the packages and cavities can also result in additional optical losses, making these overall LED components less efficient.

SUMMARY OF THE INVENTION

One embodiment of monolithic white light emitting diode (LED) package according to the present invention comprises a single or multiple color LED chip array generating greater than approximately 800 lumens at less than approximately 3000 K. The LED chip array is arranged on a substantially planar substrate with a single overmolded lens.

Another embodiment of a white emitting LED package according to the present invention comprises an LED chip array and an overmolded lens over the array having a diameter greater than 5 millimeters.

Another embodiment of a monolithic white LED package according to the present invention comprises a single or multiple color LED chip array generating greater than approximately 800 lumens at less than approximately 3000 K. The LED chip array comprises a white emitting LED array having a plurality of phosphor converted yellow-green emitting LED chips and red LED chips.

Still another embodiment of a monolithic LED package according to the present invention comprises a plurality of LED chips, wherein each of the LED chips emits light at one of at least two color groups. The LED chips emitting at each of the color groups are connected in series.

These and other aspects and advantages of the invention will become apparent from the following detailed description and the accompanying drawings which illustrate by way of example the features of the invention.

BRIEF DESCRIPTION OF THE DRAWINGS

FIG. 3 shows a sectional view of one embodiment of an LED component according to the present invention;

FIG. 4a is a sectional view of another embodiment of an LED component according to the present invention;

FIG. 4b is a perspective view of the LED component shown in FIG. 4a;

FIG. 4c is a top view of the LED component shown in FIG. 4a;

FIG. 4d is a bottom view of the LED component shown in FIG. 4a;

FIG. 5 is a top view of one embodiment of the die attach pads and conductive traces for an LED component according to the present invention;

FIG. 6a is a sectional view of still another embodiment of an LED component according to the present invention;

FIG. 6b is a detailed sectional view of a portion of the submount of the LED component shown in FIG. 6a;

FIG. 6c is a bottom view of the LED component shown in FIG. 6a;

FIG. 7 is a sectional view of another embodiment of an LED component according to the present invention having a flat lens;

FIG. 8 is a sectional view of another embodiment of an LED component according to the present invention having an aggregate optical lens;

FIG. 10 is a graph showing the different current and voltage operating requirement for different embodiments of the present invention;

DETAILED DESCRIPTION OF THE INVENTION

The present invention comprises a monolithic LED component having a plurality of LED chips mounted onto a submount to create a single compact optical source element. As used in the present application, monolithic refers to LED components wherein the LED chips are mounted on one substrate or submount. In some embodiments, at least some of LED chips are arranged in series electrical contact, with different embodiments providing multiple series connected LEDs, or combinations of series/parallel interconnect arrangements. The present invention allows for LED components to be designed and selected with a particular chip size and total LED emitting area to achieve the desired component size, and desired light output at an LED optimum current density per individual chip. This allows the LED components to be provided with the optimum efficiency at a particular cost. By flexibly choosing an LED chip size the present invention provides for a component that operates at the optimum voltage and current for the application specific, driver cost solution.

In general, LED drivers that provide output power at a lower current and higher voltage as opposed to higher current and lower voltage can incorporate lower cost electronic components (e.g. power FETs) without a reduction in driver efficiency. Depending on the particular application, it may be desirable to operate different LED components at different levels, such as 24V, 40V, 80V or similar. By utilizing different sized LED chips (assuming that the chips operate at the same current density) the operating voltage of the component can be adjusted. Further, different combinations of series and parallel connections for the LED chips on the LED component can provide the optimum system voltage and can provide for redundancy, in case one of the LED chips fails in operation. The different LED devices can also be driven at lower or higher current densities. To achieve the same light output the operation at lower current density for each of the LED chips would result in a higher LED component efficiency, but can result in the need to add additional devices. Alternatively, a lower LED component efficiency and the ability to remove LED devices from the array would be the result of targeting a higher current density operation per LED chip, with the corresponding impact on the array size. Monolithically integrated LED chips within a single cavity or under a single lens allow for LED components to be provided at the desired light emission, without substantially increasing the optical source and component size.

By providing series connected LEDs or series/parallel connected LEDs the number of external contacts to the LED component can be reduced. For each series connection only two contacts are needed corresponding to the two contacts for each LED chip. In an LED component having a single series connected LED circuit as few as two external contacts can be utilized, and in an LED component having two series connected circuits as few as four external contacts can be used. Utilizing series connected LEDs potentially also allows for a reduced number of electrostatic discharge (ESD) protection chips, with a single ESD chip of a suitable clamp voltage providing protection for multiple LED chips in each series connected circuit, as opposed to a system solution that incorporates a multitude of LED lamps, which could require an ESD chip within each lamp. For an LED component having a single series connected circuit, potentially a single ESD chip can be used.

The LED components according to the present invention can be designed to operate at different luminous flux. They can be also be designed to emit white light at different color temperatures. In other embodiments, the LED components according to the present invention can operate at color temperatures from about 6000 K down to about 2700 K. In one embodiment the monolithic LED component operates with a multiple color LED chip array producing a white luminous flux greater than 800 lumens at a color temperature less than 3000 K. The LED component comprises LED emitter chips that can be operated at favorable current and current density to allow for operation using low cost, high power efficiency emitters. One such current range is from 50 to 150 mA. Different sized LED chips can be used at this current range and emitters of various sizes could be integrated in the array.

The present invention is described herein with reference to certain embodiments, but it is understood that the invention can be embodied in many different forms and should not be construed as limited to the embodiments set forth herein. In particular, the present invention is described below in regards to arrays of LEDs in different configurations, but it is understood that the present invention can be used for many other array configurations to using other solid state emitters. The components can have different shapes and sizes beyond those shown and different numbers of LEDs can be included in the arrays. Some or all of the LEDs in the arrays can be coated with a down-converter coating that can comprise a phosphor loaded binder ("phosphor/binder coating"), but it is understood that LEDs without a conversion material can also be used.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figures 3, 4A, 4B, 4C:
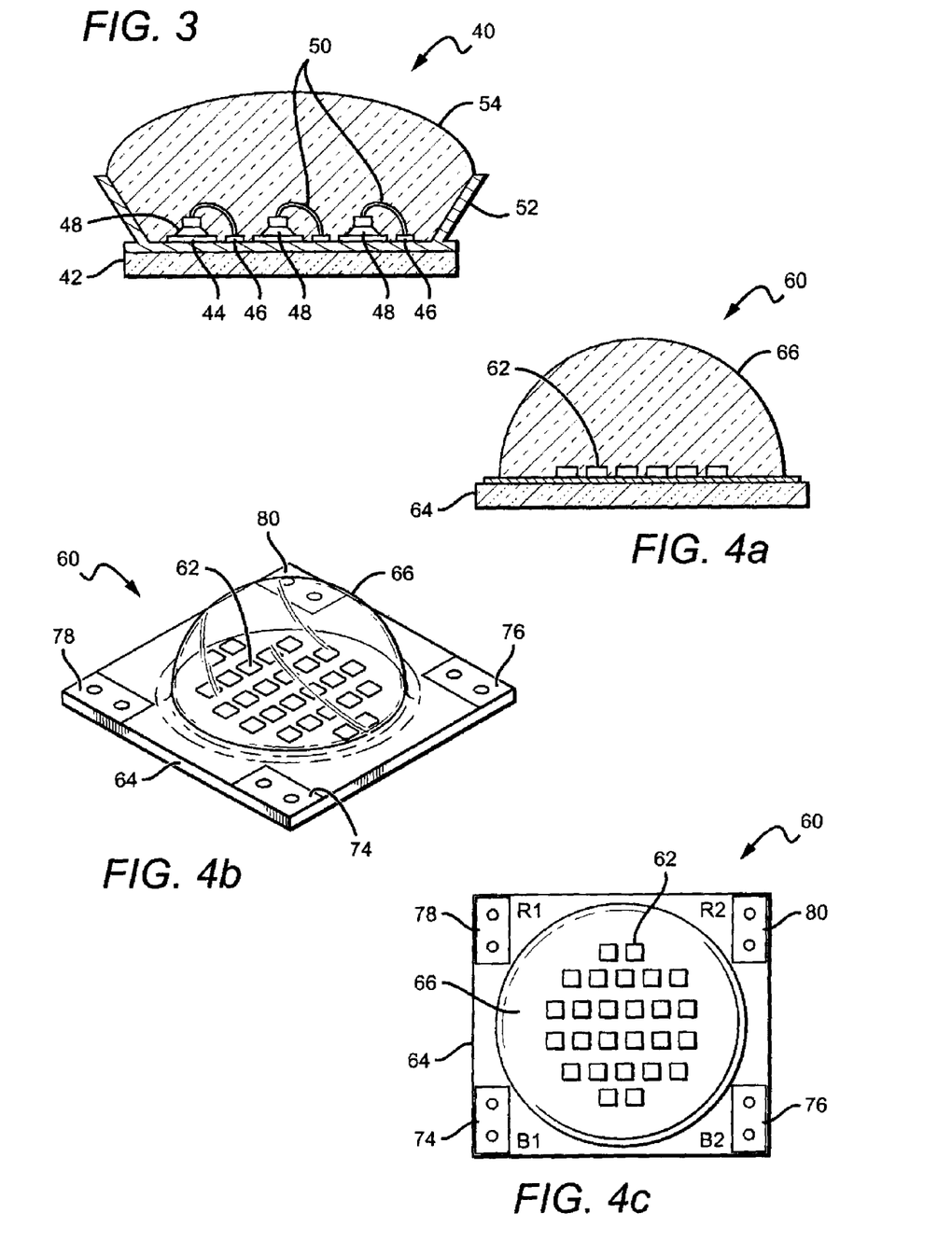

FIG. 3 shows one embodiment of an LED component 40 according to the present invention comprising a submount 42 for holding an array of LED chips, with the submount having die pads 44 and conductive traces 46 on its top surface. LED chips 48 are included that comprise the LED array, with each of the LED chips 48 mounted to a respective one of the die pads 44. Wire bonds 50 pass between the conductive traces 46 and each of the LED chips 48 with an electrical signal applied to each of the LED chips 48 through its respective one of the die pads 44 and the wire bonds 50. Alternatively, LED chips 48 may comprise coplanar electrical contacts on one side of the LED (bottom side) with the majority of the light emitting surface being located on the LED side opposing the electrical contacts (upper side). Such flip-chip LEDs can be mounted onto the submount 42 by mounting contacts corresponding to one electrode (anode or cathode, respectively) onto the die pad 44. The contacts of the other LED electrode (cathode or anode, respectively) can be mounted to the traces 46. An optional reflector 52 can be included that is mounted to submount around the LED chips 48, although in other embodiments the reflector can be arranged in different locations and can be shaped differently. The LED chips 48 in this embodiment can emit at a single color, or be coated with a down-converting phosphor with each type of LEDs being connected at least into one series connection circuit. Alternatively, multiple types of LEDs can be simultaneously mounted on the submount 42 with independent series circuits, respectively. An optical element 54 such as a lens is included over the LED chips 48.

The LED component 40 is shown with three LED chips 48, but it is understood that more LED chips can be included. At least some of the LED chips 48 are interconnected in series to minimize the number of contacts to the LED component and to allow operation with suitable drivers at the desired drive current, such as in the range of 50 to 150 mA. The "dead space" between LED chips is smaller than prior LED components and is typically less than 0.50 mm. In one embodiment the spacing is 0.15 mm to 0.01 mm depending on the mounting process, allowing for the LED components to be densely arranged on the top surface of submount 42. This allows for smaller sized devices that can have a form factor of existing lamps or even smaller, and can provide the ability to shape the output beam into a particular angular distribution.

FIG. 4a through 4d show another embodiment of a monolithic LED component 60 according to the present invention comprising an array of LED chips 62 mounted on the surface of a submount 64. At least some of the LED chips 62 are interconnected in a series circuit, with the embodiment shown having LED chips coated with a phosphor converter interconnected in one series circuit, and red emitting LEDs coupled on a second series circuit. In this embodiment the color space for the phosphor converted LEDs comprises the quadrangle in the u'v' 1976 CIE color space created by the coordinates A with u'=0.13; v'=0.42, B with u'=0.13; v'=0.57, C with u'=0.26; v'=0.54, D with u'=0.22; v'=0.51, and E with u'=0.18; v'=0.42. Correspondingly, the red LEDs cover the color quadrangle created by the coordinates E with u'=0.29; v'=0.54, F with u'=0.31; v'=0.56, G with u'=0.55; v'=0.55, and H with u'=0.53; v'=0.47. It is understood that different embodiments according to the present invention can have series interconnect circuits of the various chip types arranged in many different ways, and as described below can comprise series/parallel combination interconnect circuits.

The LED chips 62 are preferably mounted on a substantially planar surface of the submount 64 and are arranged under a single optical lens element. In the embodiment shown, the component 60 emits white light at a desired color point and color rendering index as combination of light from the various LEDs, and simultaneously emits the desired luminous flux at high efficacy.

The LEDs chips 62 can have many different semiconductor layers arranged in different ways and can emit many different colors in different embodiments according to the present invention. LED structures, features, and their fabrication and operation are generally known in the art and only briefly discussed herein. The layers of the LEDs chips 62 can be fabricated using known processes with a suitable process being fabrication using metal organic chemical vapor deposition (MOCVD). The layers of the LED chips generally comprise an active layer/region sandwiched between first and second oppositely doped epitaxial layers all of which are formed successively on a growth substrate. LED chips can be formed on a wafer and then singulated for mounting in a package. It is understood that the growth substrate can remain as part of the final singulated LED or the growth substrate can be fully or partially removed.

It is also understood that additional layers and elements can also be included in the LED chips 62, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such at sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

The LED chips 62 can also comprise a conductive current spreading structure and wire bond pads on the top surface, both of which are made of a conductive material and be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on the LED chips 62 with the fingers spaced to enhance current spreading from the pads into the LED's top surface. In operation, an electrical signal is applied to the pads through a wire bond as described below, and the electrical signal spreads through the fingers of the current spreading structure and the top surface into the LED chips 62. Current spreading structures are often used in LEDs where the top surface is p-type, but can also be used for n-type materials.

Each of the LED chips 62 can be coated with one or more phosphors with the phosphors absorbing at least some of the LED light and emitting a different wavelength of light such that the LED emits a combination of light from the LED and the phosphor. In one embodiment according to the present invention the white emitting LEDs chips 62 have an LED that emits light in the blue wavelength spectrum and the phosphor absorbs some of the blue light and re-emits yellow. The LED chips 62 emit a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:
$Tb_{3-x}RE_xO_{12}$:Ce(TAG); RE=Y, Gd, La, Lu; or
$Sr_{2-x-y}Ba_xCa_ySiO_4$:Eu.

The LED chips 62 emitting red light can comprise LED structures and materials that permit emission of red light directly from the active region. Alternatively, in other embodiments the red emitting LED chips 62 can comprise LEDs covered by a phosphor that absorbs the LED light and emits a red light. Some phosphors appropriate for this structures can comprise:
Red
$Lu_2O_3$:$Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:$Pr^{3+}$, $Ga^{3+}$
$CaAlSiN_3$:$Eu^{2+}$
$Sr_2Si_5N_8$:$Eu^{2+}$ The LED chips 62 can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The submount 64 can be formed of many different materials with a preferred material being electrically insulating, such as a dielectric element, with the submount being between the LED array and the component backside. The submount can comprise a ceramic such as alumina, aluminum nitride, silicon carbide, or a polymeric material such as polymide and polyester etc. In the preferred embodiment, the dielectric material has a high thermal conductivity such as with aluminum nitride and silicon carbide. In other embodiments the submount 64 can comprise highly reflective material, such as reflective ceramic or metal layers like silver, to enhance light extraction from the component. In other embodiments the submount 64 can comprise a printed circuit board (PCB), alumina, sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

It is understood that LED components according to the present invention can be fabricated using a method that incorporates submount panel or wafer comprising a plurality of submounts. Each of the submounts 64 can be formed with its own array of LEDs and optical elements 66 such that multiple LED components 60 can be formed across the submount panel. Multiple LED components 60 can then be singulated from the submount panel. Each submount 64 may also comprise a more complex combination of elements such as a plurality of "submount" assemblies which are mounted on a planar surface of submount. As more fully described below, the submount assemblies can have different functionalities such as providing ESD protection for the various LED chips.

The size of the submount 64 in LED package 60 can vary depending on certain factors such as the size and number of LEDs. In one embodiment, the sides of the submount can be approximately 12 mm by 13 mm. It is further understood that the submount 64 can have other shapes including circular, oval, rectangular, hexagonal or other multiple sided shapes.

Figures 4D, 5, 6A:
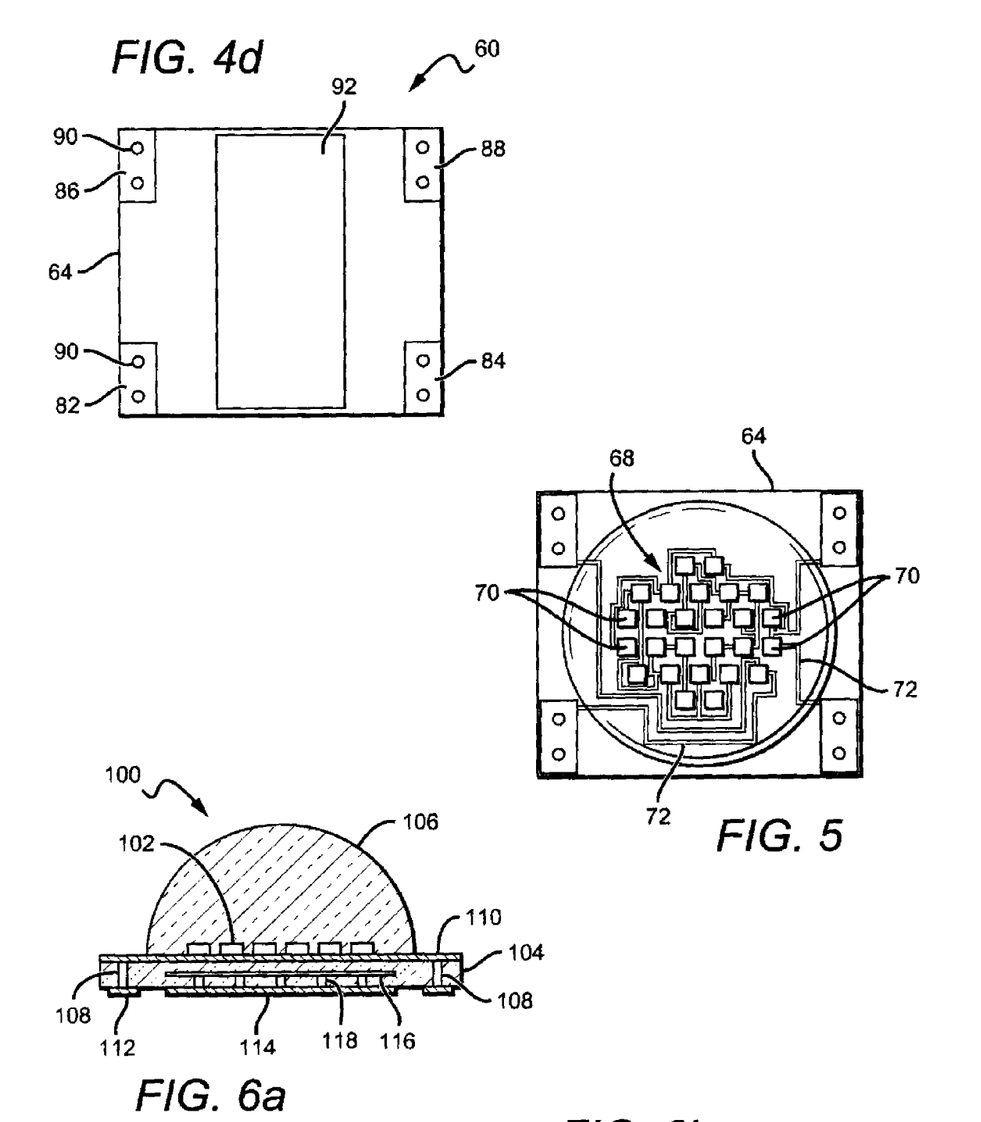

Referring now to FIG. 5, the top surface of the submount 64 is shown having planar surface with patterned conductive features 68 that can include die attach pads 70 and interconnecting conductive traces 72. These features 68 provide conductive paths for electrical connection to the LED chips 62 (shown in FIGS. 4a to 4c) using known contacting methods. Each of the LED chips 62 can be mounted to a respective one of the attach pads 70 using known methods and material mounting using conventional solder materials that may or may not contain a flux material. The LED chips 62 can similarly be mounted and electrically connected to the conductive traces 72 using known surface mount or wire bonding methods depending on the geometry of the LED chips 62. Alternatively, flip chip LEDs can be mounted as described above on the attach pads and conductive traces.

The attach pads 70 and interconnecting traces 72 can comprise many different materials, such as metals or other conductive materials, and in one embodiment they can comprise copper deposited using known techniques such as plating. In one typical deposition process a titanium adhesion layer and copper seed layer are sequentially sputtered onto a substrate. Then, approximately 75 microns of copper is plated onto the copper seed layer, although different metal thicknesses may be used. The resulting copper layer being deposited can then be patterned using standard lithographic processes. In other embodiments the layer can be sputtered using a mask to form the desired pattern.

In other embodiments according to the present invention some or all of the features 68 can comprise other additional materials beyond copper. For example, the die attach pads can be plated or coated with additional metals or materials to the make them more suitable for mounting one of the LED chips 62. The attach pads can be plated with adhesive or bonding materials, or reflective and barrier layers.

As described above, the LED chips 62 are interconnected in two serial circuits comprising phosphor coated LED chips and red emitting LED chips, respectively. The LED component comprises bond pads for applying a respective electrical signal to the white and red emitting LEDs. As best shown in FIG. 4b, first and second bond pads 74, 76 are provided on the surface of the submount 64 for applying an electrical signal to the serially red LED chips of the LED array 62. Third and fourth bond pads 78, 80 are also provided for applying an electrical signal to the serially connected phosphor coated LED chips of the LED array 62. The LED component can include markings to assist in making the correct electrical connection with the proper bond pads for the red LED chips designated R1 and R2, and the bond pads for the white emitting LED designated B1 and B2. The conductive traces 72 provide the interconnect scheme for the red and blue serial connected circuits, and in one embodiment, the interconnect scheme provides interconnections in a single layer, with less than two traces running between the LEDs.

Electrical signals can be applied to the LED component 60 by providing external electrical contact to the first, second, third and fourth bond pads, such as by wire or ribbon bonding or other connection methods such as the soldering of leads, special connectors or mounting the LED component to conductive paths on for example, a PCB. In the embodiment shown the LED component 60 is arranged for mounting using surface mount technology. The LED 60 comprises first, second, third and fourth surface mount pads 82, 84, 86, 88 (best shown in FIG. 4d) that can be formed on the back surface of the submount 64, at least partially in alignment with its corresponding one of bond pads 74, 76, 78, 80 on the submount's front side. Conductive vias 90 are formed through the submount 64 between the corresponding surface mount and bond pads, such that when a signal is applied to the surface mount pads 82, 84, 86, 88 it is conducted to its corresponding bond pad through its vias. The surface mount pads 82, 84, 86, 88 allow for surface mounting of the LED package 60 with the electrical signal to be applied to the LED component applied to the surface mounting pads. The vias 90 and surface mount pads 82, 84, 86, 88 can be made of many different materials deposited using different techniques, such as those used for the attach and bond pads.

It is understood that the surface mount pads 82, 84, 86, 88 and vias 90 can be arranged in many different ways and can have many different shapes and sizes. Other embodiments can use structure other than vias, including one or more conductive traces on the surface of the submount between the mounting pads and contact pads, such as along the side surface of the submount.

A solder mask can also be included on the submount's top or bottom surface at least partially covering the conductive traces 72, portions of the other conductive features or portions of the ceramic surface. The bond pads and die attach pads are typically left uncovered, with the solder mask protecting the conductive traces 72 and other covered features during subsequent processing steps and in particular mounting the LED chips 72 to the die attach pads 70. During these steps there can be a danger of solder or other materials depositing in undesired areas, which can result in damage to the areas or result in electrical shorting. The solder mask serves as an insulating and protective material that can reduce or prevent these risks.

The LED component 60 can also comprise elements to protect against damage from electrostatic discharge (ESD), and can be on or off that submount 64. Different elements can be used such as various vertical silicon (Si) Zener diodes, different LEDs arranged in parallel and reverse biased to the LED chips 62, surface mount varistors and lateral Si diodes. In the embodiments using a Zener diode, it can be mounted to the separate attach pad using known mounting techniques. The diode is relatively small so that it does not cover an excessive area on the surface of the submount 64, and when utilizing groups of LEDs coupled in series only one ESD element is needed for each series group.

It is desirable to have the LED chips 62 densely arranged on the submount 64 to minimize the size of the submount 64 and the footprint of the component, and to enhance color mixing in those embodiments having LED chips emitting different colors of light. For LED chips 62 that are close to one another, however, heat from the LED chips 62 can spread to adjacent LED chips 62 or can accumulate in a concentrated area of the submount 64 below the LED chips 62. To enhance dissipation of heat generated by the LED chips 62 during operation the LED component 60 can comprise integrated features to enhance thermal dissipation. One way to enhance thermal dissipation on the front side of the submount 64, is to have die attach pads that are thermally conductive and extend on the front surface of the submount 64 beyond the edge of the LED chips. Heat from each of the LED chips can spread into its die attach pad and beyond the width of the extended die pads providing a larger surface area to dissipate heat. Larger die pads, however, can be a limiting factor on how close the LEDs can be to one another.

In some embodiments, the LED chips can remain densely arranged and the thermal dissipation from the LED chips 62 in component 60 can be enhanced by having die attach pads 70 and interconnected traces 72 made of an electrically and thermally conductive material. During operation of the component, electrical signals can be applied through the attach pads and traces 70, 72, and heat can likewise spread from the LED chips into the attach pads and traces 70, 72 where it can dissipate or be conducted through the submount. Many different electrically and thermally conductive materials can be used, with a preferred material being a metal such as copper.

Referring now to FIG. 4d, to further enhance thermal dissipation LED component 60 can further comprise a neutral metalized pad 92 on the back surface of the submount 64. In regards to metalized pad 92, neutral refers the pad 92 as not being electrically connected to LED chips or the features 68 (as shown in FIG. 5). The metalized pad 92 is preferably made of a heat conductive material and is preferably in at least partial vertical alignment with the LED chips 62. Heat from the LED chips that does not spread through the attach pads and traces 70, 72 can be conducted into the submount 64 directly below and around the LED chips 62. The metalized pad 92 can assist with heat dissipation by allowing this heat below and around the LED chips 62 to spread into the metalized pad 92 from where it can dissipate or be more readily conducted to suitable heat sinks. The pad 92 is shown as being rectangular, but it is understood that it can have many different shapes and sizes and can comprise a plurality of pads having different shapes and sizes. Heat can also conduct from the top surface of the submount 64, through the vias 90, where the heat can spread into the first and second mounting pads 82, 84, 86, 88 where it can also dissipate.

An optical element or lens 66 can be formed on the top surface of the submount 64, over the LED chips 62, to provide both environmental and/or mechanical protection and beam shaping while simultaneously aiding the light extraction from the LEDs 62 and shaping of the light beam. The lens 66 can be in different locations on the submount 64 with the lens 66 located as shown in alignment with the center of the array of LED chips being at approximately the center of the lens base. In some embodiments the lens 66 is formed in direct contact with the LED chips 62 and the top surface 64. In other embodiments there may be an intervening material or layer between the LED chips 62 the lens 66 such as a waveguide or air gap. Direct contact to the LED chips 62 provides certain advantages such as improved light extraction and ease of fabricating.

In one embodiment, the lens 66 can be overmolded on the submount 64 and LED chips 62 using different molding techniques, and the lens 66 can be of many different shapes depending on the desired shape of the light output. One suitable shape as shown is hemispheric, with some examples of alternative shapes being ellipsoid bullet, flat, hex-shaped and square. Hemispheric lenses can provide for an essentially lambertian emission with 120 degrees FWHM, while the other optical lenses can have other shapes to provide for different emission patterns at different angles.

For hemispheric embodiments, many different lens sizes can be used, with typical hemispheric lenses being greater than 5 mm in diameter, with one embodiment being greater approximately 11 mm. The preferred LED array size to lens diameter ratio should be less than approximately 0.6, and preferably less than 0.4. For such hemispheric lenses the focal point of the lens shall be essentially at the same horizontal plane as the emission region of the LED chips.

In yet other embodiments, the lens can have a large diameter of about the same or larger than the distance across or width of the LED array. For circular LED array the diameter of the lens can be approximately the same as or larger that the diameter of the LED array. The focal point for such lenses is preferably below the horizontal plane created by the emitting region of the LED chips. The advantage of such lenses is the ability to spread the light over larger solid emission angles and therefore allow for a broader illuminated area.

Many different materials can be used for the lens 66 such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that the lens 66 can also be textured or coated with anti-reflection coatings to improve light extraction or can contain materials such as phosphors or scattering particles.

In one embodiment a molding process is used that simultaneously forms lenses 66 over a multitude of LED arrays on a submount panel. One such molding process is referred to as compression molding wherein a mold is provided having a plurality of cavities each of which has an inverted shape of the lens. Each cavity is arranged to align with a respective one of the LEDs arrays on the submount panel. The mold is loaded with a lens material in liquid form filling the cavities, with the preferred material being liquid curable silicone. The submount panel can be moved toward the cavity with each of the LEDs arrays being embedded in the liquid silicone within one a respective one of the cavities. In one embodiment a layer of silicone can also remain between adjacent lenses that provides a protective layer over the top surface of the submount. The liquid silicone can then be cured using known curing processes. The panel can then be removed from the mold and the panel can comprise a plurality of lenses, each of which is over a respective one of the LED chips 62. The individual LED components can then be separated or singulated from the submount panel, using known techniques.

Other embodiments according to the present invention can comprise different features to enhance thermal dissipation. FIGS. 6a though 6c show another embodiment of an LED component 100 according to the present invention comprising an LED array 102 mounted to a submount 104, with an optical element or lens 106 over the LED array 102, all similar to the corresponding elements in the LED component 60 described above in FIGS. 4a through 4d. Conductive vias 108 are included that pass through the submount 104 to provide electrical connection between the bond pads 110 and surface mount pads 112. This allows for surface mounting of the LED component, but it is understood that other features can be included to allow for other mounting techniques. The LED component 100 further comprises neutral metalized pad 114 to assist in thermal dissipation as described above.

Figure 6B:
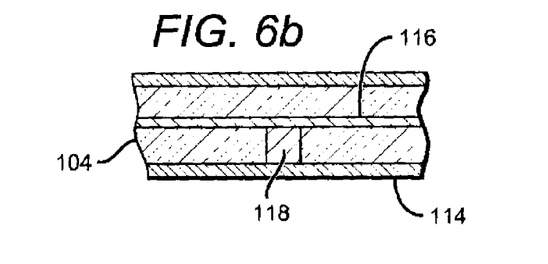

To further assist in heat dissipation in LED component 100, the submount 104 can include additional heat features incorporated within the submount. These features can be used in submounts made of many different materials, but are particularly applicable to ceramic submounts. The additional features can comprise a heat spreading layer 116 internal to the submount 104 but preferably not electrically connected to the vias 108. The layer 116 is preferably arranged below the LED array 102 such that heat from the array 102 spreads into the layer 116. The layer 116 can be made of many different thermally conductive materials, including but not limited to copper, silver or a combination thereof. The LED component can also comprise partial thermal vias 118 running between the heat spreading layer 116 and the neutral metalized pad 114. In the embodiment shown, the partial thermal vias 118 do not protrude past the layer 116 to the top surface of the submount 104 to maintain a flat mounting surface for the LED array 102 and its corresponding mounting pads. It is understood however, that in some embodiment the vias can protrude at least partially above the heat spreading layer 116.

The layer 116 and partial vias 118 can be formed within the submount using different methods, with one suitable utilizing high or low temperature co-fired ceramic technology or multilayer thick film post-firing technology. In those embodiments where the layer 116 is made of copper or silver, thick film co-firing or post-firing process can be used due to high thermal conduction nature of these materials, to yield the desired configuration. Other fabrication processes to form the spreading layer 116 and vias 118 can be through multilayer printed circuit board and flexible circuit board technology, generally known in the industry.

Figures 6C, 7, 8, 10:
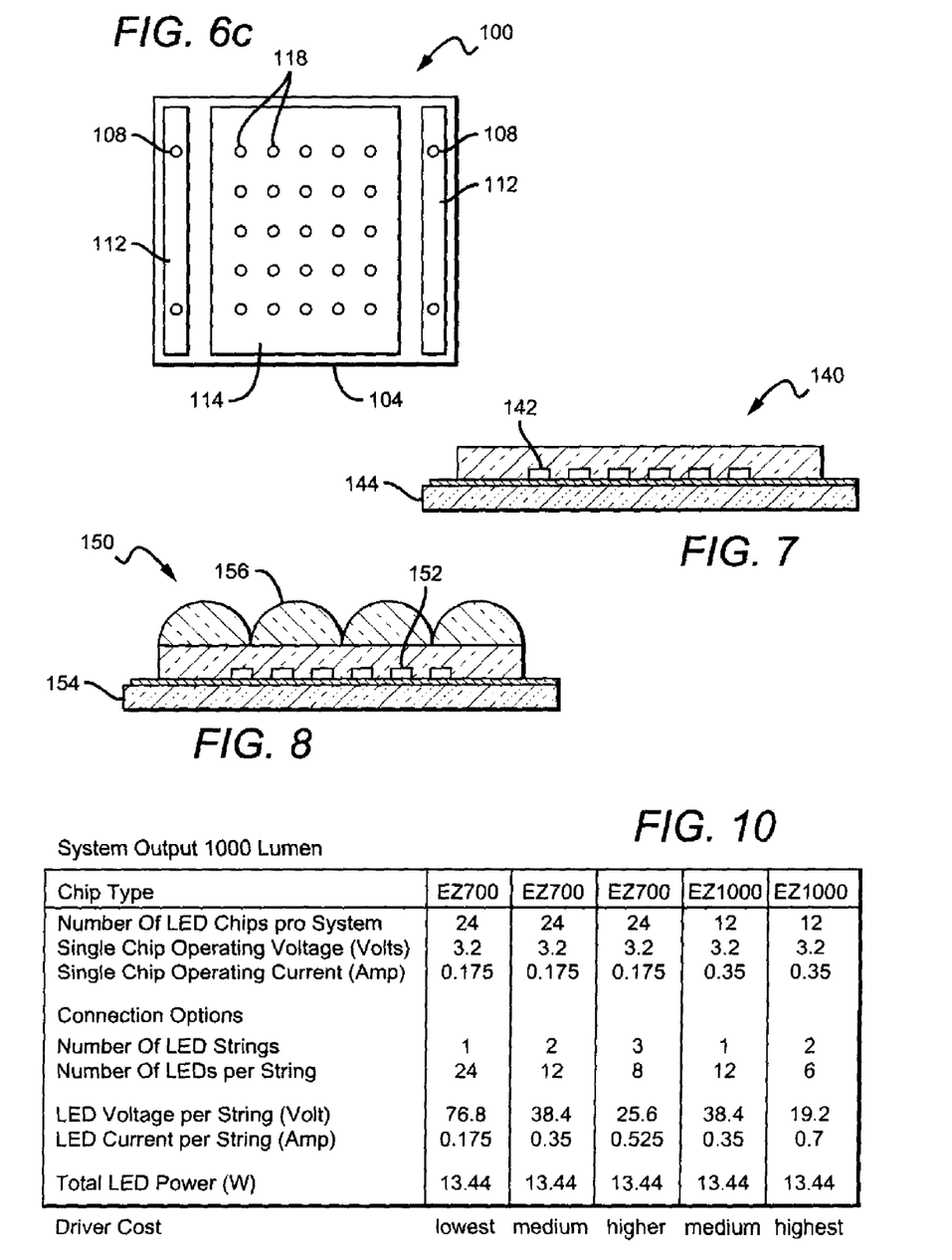

FIGS. 7 and 8 show additional embodiments of monolithic LED components according to the present invention with a different shaped lens. The LED component 140 in FIG. 7 comprises LED chips 142 mounted in an array to a submount 144, with a flat optical lens covering the LED chips. The LED component 150 in FIG. 8 comprises LED chips 152 mounted in an array on a submount 154, with an aggregate optical lens 156 over the LED chips 152. The aggregate lens 156 includes a plurality of convex optical features to control the light extraction from the LED array and shape the emitted light into particular beam shapes and emission angles. In other embodiments the aggregate lens can include concave optical features, or a combination of convex and concave features, such as a Fresnel lens.

Other monolithic LED components according to the present invention can incorporate a number of different features such as an optical fiber, mirror, reflector, scattering surface or lens, or combination thereof. These features can act to direct or otherwise modify the distribution of light from the component. The lens arrangement of the LED component 60 is also easily adapted for use with secondary lens or optics that can be includes over the lens by the end user to facilitate beam shaping. These secondary lenses are generally known in the art, with many of them being commercially available.

As mentioned above, the LED chips in the LED array are preferably arranged with the interconnecting electrical traces in a way to provide for dense packaging of the emitters on the submount, with the non-emitting space between the LED emitters minimized. The space can vary in different embodiments and can vary between LED chips in one embodiment. The distance between the LED chips can range from 5 micron or less, to 500 microns or more. In one embodiment, the space is 150 microns or less.

In some embodiments the emitters are arranged in an array on the submount surface in a substantially symmetrical two dimensional layout. In one of these embodiments the LEDs in the array are densely arranged in substantially spherical shape. For LEDs arrays having groups of LEDs emitting at different colors of light an symmetric pattern is particularly applicable to smaller LEDs in the LED array, where different colors can be intermixed in the array to achieve the desired color mixing. For arrays having larger LEDs, an asymmetric array may enhance color mixing.

In other embodiments the LEDs emitting at a particular color of light can be arranged with respect to the LEDs emitting at other colors of light in a systematic geometrical order. In one such embodiment, the LEDs of different colors of light can be arranged in substantially circular arrays of approximately the same inscribed area for each color group and the groups of LEDs can be radially offset with respect to each other.

Different embodiments of the LED component 60 can have LED arrays with different sized LEDs and different numbers of LEDs, with certain factors applicable in determining the desired arrangement for both. For larger LED sizes the desired luminous flux can be provided with fewer LEDs, but in LED components utilizing LEDs emitting different colors of light, larger LEDs can result in ineffective color mixing. To improve color mixing, larger numbers of smaller LEDs can be used. This, however, can result in more complex interconnection schemes.

The LED arrays can also have LEDs that are substantially the same size. In one embodiment the LED chip size area is greater than 500 microns, although LEDs having smaller chip sizes can also be used. In one embodiment the LEDs have a chip size of approximately 700 microns. The edges of the LED emitters can be different lengths, with one embodiment having lengths of approximately 0.4 to 0.7 mm. Many different numbers of LED chips can be included in the array, and in some embodiments the number of LED chips is greater than 20, but fewer LED chips can also be used. The LED component 60 comprises 26 LED chips of which 20 are white emitting LED chips and 6 are red emitting LED chips.

As discussed above, at least some of the LED emitters are electrically connected in series to provide for at least one serial circuit, with the LED array component capable of emitting multiple colors of light, including white light. In some embodiments having arrays with groups of LEDs emitting different colors of light (e.g. white and red), the LEDs of each color are electrically connected in series. As discussed above, the LED component 60 can provide for respective electrical connections to these serial circuits to control the operating voltage and current for each circuit separately. Such electrical connection pads can be provided on the front side, backside, or both. Backside electrodes provide for SMT mounting capability on PCB boards.

Figure 9:
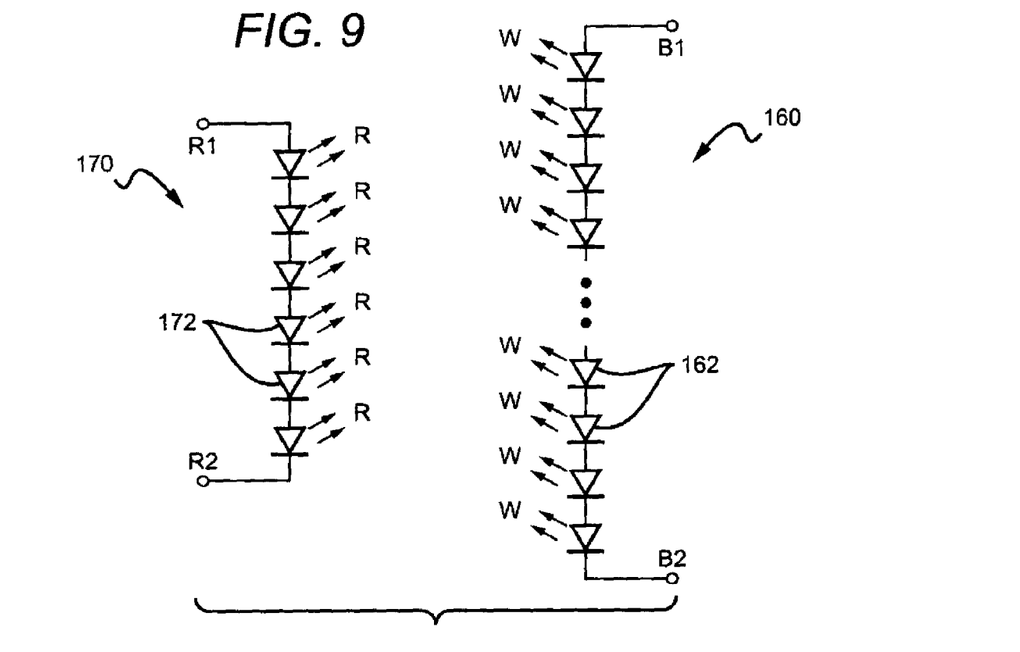
FIG. 9 is a schematic of an LED chip interconnection for one embodiment of an LED component according to the present invention.

FIG. 9 shows a schematic of one embodiment of two series connected LED circuits that can be used for the array of LED chips shown in FIGS. 4a through 4d. The first series circuit 160 comprises twenty (20) phosphor coated LED chips 162 (only 8 shown) that can comprise serially connected blue emitting LEDs coated with one or more phosphor. The combined LED and phosphor emission convert the blue to green, and/or yellow spectral ranges, with the LED emitting a mixed light combination of light from the LED and phosphor. The second series 170 comprises 6 serially connected red emitting LEDs chips 172. Respective electrical signals can be applied to the first and second circuit 160 and 170 so that each can be driven by a different drive current.

The red LED chips can provide direct emission without the use of a converter material. The phosphor coated and red LED chips 162 and 172 are shown in the schematic as physically separate for ease of understanding, but when physically placed in the array the red and white LED chips can be randomly mixed. The mixed emission from the first and second series connected circuits can be cool or warm white light. The emission can have different color renderings, with one embodiment having a color rendering index of greater than 85.

Allowing respective electrical signals to be applied to the phosphor coated and red LED chips within with the array allows for independent electrical control of the different groups of LED colors. In particular this can allow for independent drive currents to the different groups. In one embodiment, the red LED chips can have a different temperature sensitivity compared to the phosphor coated LED chips, and as temperature goes up it can be necessary to increase the drive current to the red LED chips to maintain the desired luminous flux or reduce the drive current through the phosphor coated LEDs, respectively. Any temperature sensitivity with the phosphor coated LED chips can also be compensated for by varying drive current with temperature. This allows for the LED array to emit at or near the desired color point through different temperatures. In other embodiments, the likely temperature range for the LED components can be known. The LED components can then be designed for that range such that the drive conditions are present.

In other embodiments, different combinations of phosphor coated and red emitting LEDs can be used to achieve the desired color rendering index. In the embodiment having 20 phosphor coated emitting LED chips and 6 red emitting LED chips, the phosphor coated LED chips are preferably coated with a phosphor with an emission characteristics corresponding to u' of about 0.220 and v' of about 0.560 in the 1976 CIE color coordinate system. The corresponding mixed white light emission from the LED component has a color temperature of about 2800K and a color rendering index>85. For phosphor coated LED chips coated with a phosphor with an emission corresponding to u' of about 0.206 and v' of about 0.560, 18 white LED chips can be combined with 8 red emitting LED chips to reach the desired color temperature and color render index. This corresponds to phosphor coated LED chips that emit closer to the black body locus (BBL) on the CIE curve needing fewer red emitting LEDs, while conversely phosphor coated LED chips emitting further from the BBL may require a greater red luminous flux or a greater number of red emitting LEDs to reach a white emission on the black body locus. It is understood that other ratios and color points of phosphor coated and red LED chips can also be used to target different white emission properties.

As discussed above, the different number of series connected LED chip circuits can impact the operating voltage and current of LED components according to the present invention. FIG. 10 shows a graph comparing different 1000 lumen LED component arrangements for commercially available EZ700 and EZ1000 EZBright™ LED chips provided by Cree, Inc. Using the EZ700 with twenty-four (24) chips in a single series connection circuit, operational current of 0.175 amps and voltage of 76.8 volts can be used. This provides the lowest cost driver solution. As the number of series connected circuits increase, the driver current required also increases while the driver voltage decreases. This typically increases the cost of the drivers, but the additional series connected circuits allow for greater control over the LED chips in the LED component. The similar trade-off in voltage or current requirements verses emission control applies for LED components having twelve (12) EX1000 LED chips.

Figure 11:
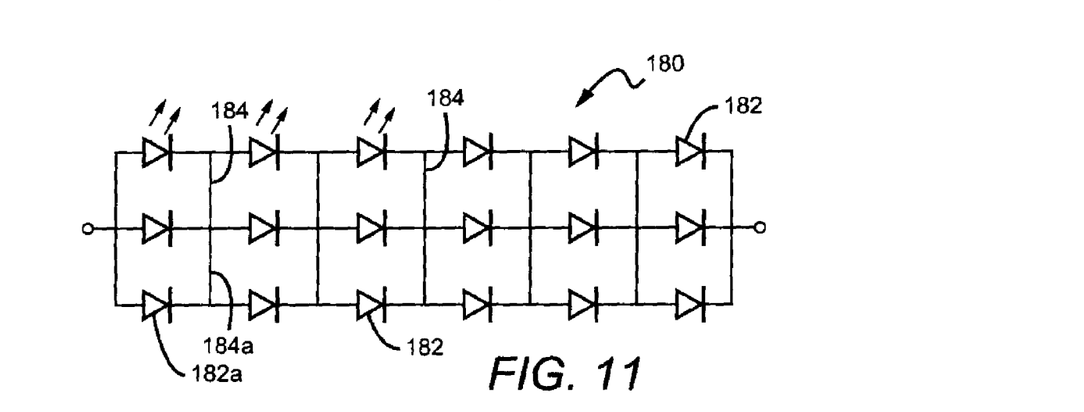
FIG. 11 is a schematic of an LED chip interconnection for another embodiment of an LED component according to the present invention.

The LED arrays according to the present invention can also comprise arrays of LEDs chips arranged in a serial/parallel interconnection. FIG. 11 shows one embodiment of a series/parallel interconnection 180 comprising eighteen (18) white LED chips 182 arranged in a three by six serial/parallel interconnection, comprising three sets of six LED chips 182 connected in series. The three sets are then coupled in parallel. This serial/parallel arrangement can lower the voltage necessary to drive the LED, while still allowing for reduced drive currents. The interconnection 180 can also comprise jumpers 184 or interconnection nodes being placed after groups of one or more series connected LEDs and between the LEDs. The jumpers 184 allow for the electrical signal applied to the LEDs to bypass a failed LED. For instance, if one of the LED chips 182 failed, such as LED chip 182*a*, the electrical signal to be applied to the LED chips that follow in series could be interrupted. By including bypass jumpers 184, and in particular bypass jumper 184*a*, the electrical signal can bypass failed LED chip 182*a* through for example jumper 184*a* so that the electrical signal can pass to the LED chips following in series from the failed LED chip 182*a*.

Figure 12:
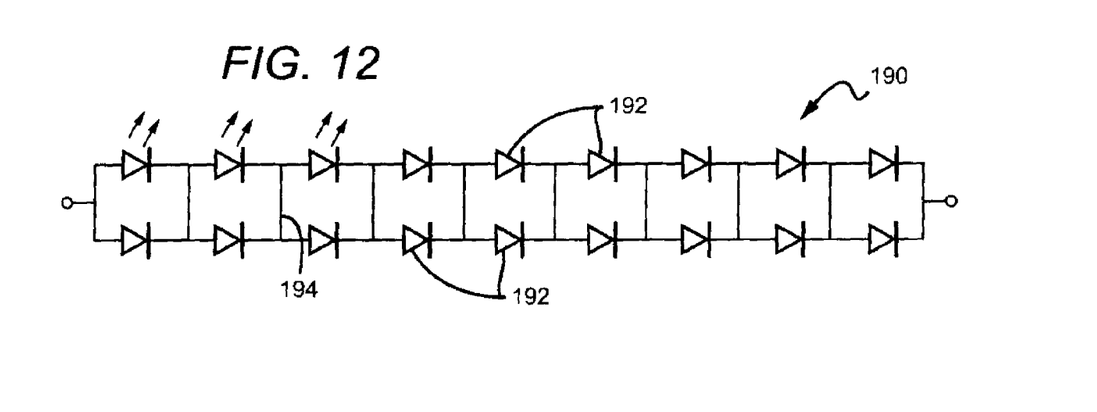
FIG. 12 is a schematic of an LED chip interconnection for still another embodiment of an LED component according to the present invention.

FIG. 12 shows another embodiment of a series/parallel interconnection 190 having two sets of nine LED chips 192 coupled in series, with the two sets coupled in parallel. Jumpers 194 are included to bypass failed LED chips. Different series/parallel interconnection can have different arrangements including with the different series coupled LED chips having the same or different numbers of LED chips. For example, the eighteen (18) LED chips shown can have series LED circuits of five, six and seven, with each of the series circuits coupled in parallel.

In other embodiments color sub-groups of LEDs can be provided that combine to achieve the particular color that would otherwise be provided by a single color group. For example, if it is desired to provide a particular color emission from the first color group, the group can comprise phosphor coated LEDs emitting at the particular desired color line. A second color group comprises red emitting LEDs can be provided with the resulting combined emission from the first and second groups being at or near the desired emission on the black body line of the CIE curve. Under certain circumstances it may be desirable to include two or more serially connected sub-groups to achieve the color desired from one of the first or second groups. By way of example, two color sub-groups can be utilized to provide the emission of the first color group. If the desired emission from the first group is at a particular color line, the first sub-group can emit light below the color line and the second sub-group can emit light above the color line. The combination of light from the sub-groups can provide the desired light that would otherwise be provided by the first group.

The sub-groups can be coupled in series such that each can be independently controlled to provide the desired luminous flux and color mixing, and to compensate for emission inefficiencies. In embodiments where the flux of the sub-groups is such that application of the same electrical signal results in the desired color point, the same signal can be applied to each of the sub-groups.

The present invention is directed to many different LED chip arrangements with the individual LED chips either coated by a converting phosphor or emitting light directly from their active region. In one alternative embodiment, a single or plurality of series connected LED chip circuits can comprise LED chips wherein all are coated with a single down-converting material. The mixed emission from the LED and the down-converting material can be cool or warm light. In one embodiment, all the LED chips emitter are blue LEDs covered with phosphor.

It is understood that the LED chips in the arrays can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same", the disclosure of which is incorporated by reference.

Another embodiment can comprise a single or plurality of series connection LED circuits, with all the LED chips comprising LEDs being coated with two or more down-converting materials like a phosphor. The combined LED and phosphor emission can cover different spectral ranges such as blue, green, yellow and red spectral ranges. The mixed emission can be cool or warm white light with a color point on the black body locus or within an 8-step Mac Adam ellipse thereof with high color rendering index of greater that 85. The phosphor composition can be for example selected from materials discussed above.

In still other embodiments of an LED component according to the present invention can comprise a plurality of series connection circuits comprising LED chips that emit light directly from their active region, with at least one series circuit provided for red, green and blue emitting LEDs, respectively. In other embodiments series connected LEDs circuits can also be added emitting cyan, yellow and/or amber. The LED component preferably emits a white light combination of light from the series circuits that has a high color rendering index of greater than 85.

Still other embodiments can comprise different LED chips with LEDs emitting at different wavelengths. For example, in any of the LED chip configurations above in which at least one of the emitters comprises a short wavelength emitter in conjunction with one or more phosphor emitters, an ultraviolet emitting LED can be used as the LED. This results in the predominant emission component of the LED chips coming from the phosphor coating the ultraviolet LED. Each of the following phosphors exhibits excitation in the UV emission spectrum, provides a desirable peak emission, has efficient light conversion, and has acceptable Stokes shift:

Yellow/Green
$(Sr, Ca, Ba) (Al, Ga)_2S_4:Eu^{2+}$
$Ba_2(Mg, Zn) Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y) SiO_4:Eu$
$Ba_2SiO_4:Eu^{2+}$ The LED components according to the present invention are particularly applicable to integration is solid state lighting luminares, and provide for surface mount or wire bond mounting in the luminaries. The LED components provide an improvement in the lumens provided per cost, due to the reduced assembly requirements and footprint in luminaries along with reduced driver costs as described above.

Although the present invention has been described in detail with reference to certain preferred configurations thereof, other versions are possible. Therefore, the spirit and scope of the invention should not be limited to the versions described above.

We claim:

1. A white emitting light emitting diode (LED) package comprising an LED chip array and an overmolded lens over said array having a diameter greater than 5 millimeters, wherein said lens has a diameter being approximately the same as or larger than the width of said array.

2. The LED package of claim 1, wherein said lens has a diameter of approximately 11 millimeters.

3. The LED package of claim 1, wherein said LED chip array comprises 26 LED chips, each of which emits light at one of a plurality of colors.

4. The LED package of claim 1, wherein said lens comprises a hemispheric lens having a diameter of approximately 11 millimeters.

5. The LED package of claim 1, wherein the focal point of said lens is located in or below the horizontal plane created by the emitting region of the LED chips.

6. The LED package of claim 1, wherein said lens comprises an aggregate of multiple optical elements.

7. The LED package of claim 1, wherein said lens comprises an essentially flat optically transparent element.

* * * * *